United States Patent [19]
Ramesh et al.

[11] Patent Number: 6,115,436
[45] Date of Patent: Sep. 5, 2000

[54] NON-BINARY VITERBI DECODER USING BUTTERFLY OPERATIONS

[75] Inventors: Rasaram Ramesh, Cary; George Kellam, Hillsborough, both of N.C.

[73] Assignee: Ericsson Inc., Research Triangle Park, N.C.

[21] Appl. No.: 09/002,563

[22] Filed: Dec. 31, 1997

[51] Int. Cl.[7] .................................................. H04L 1/00
[52] U.S. Cl. ........................ 375/341; 714/795; 714/796
[58] Field of Search .................................. 375/265, 341; 714/794–796

[56] References Cited

U.S. PATENT DOCUMENTS

| | | | |
|---|---|---|---|
| 5,068,859 | 11/1991 | Collins et al. | 371/43 |
| 5,539,757 | 7/1996 | Cox et al. | 371/43 |
| 5,588,028 | 12/1996 | Parizhsky | 375/341 |
| 5,703,911 | 12/1997 | Lin et al. | 375/341 |

FOREIGN PATENT DOCUMENTS

98/27346  4/1999  WIPO .

OTHER PUBLICATIONS

Bernard Sklar, Digital Communications, 1988, pp. 333–338.
C. C. Clark and J. Bibb Cain, "Error–Correction Coding for Digital Communications," 1983, Plenum Press, New York, XP–002099251, pp. 258–261.
C. C. Clark and J. Bibb Cain, "Error–Correction Coding for Digital Communications," 1983, Plenum Press, New York, XP–002099252, pp. 235–238.
W. E. Ryan and S. G. Wilson, "Two Classes of Convolutional Codes Over GF(q) for q–ary Orthogonal Signaling," *IEEE Transactions on Communications*, vol. 39, No. 1, Jan. 1991, pp. 30–40, XP–000220444.

*Primary Examiner*—Amanda T. Le
*Attorney, Agent, or Firm*—Jenkens & Gilchrist, P.C.

[57] ABSTRACT

A decoder for decoding a data signal using a non-binary trellis diagram by designating binary butterfly trellises within the non-binary trellis is disclosed. The decoder analyzes each designated binary butterfly trellis using the basic Viterbi binary butterfly operation to generate a pair of pathways to each node of the non-binary trellis. The pathways for each node from the basic binary butterfly operations are compared to determine the survivor path for that node.

18 Claims, 3 Drawing Sheets

NON-BINARY VITERBI DECODER USING BUTTERFLY OPERATIONS

BACKGROUND OF THE INVENTION

1. Technical Field of the Invention

The present invention relates to receivers in a digital communications system, and more particularly to decoders for decoding non-binary convolutional coded data using a modified Viterbi algorithm.

2. Background of the Invention

FIG. 1 illustrates a typical digital communications system which includes a transmitter 12, receiver 14, and channel 24. The transmitter includes a channel encoder 16, multiplexer 18, modulator 20 and transmitter unit 22. The transmitter 12 may include other signal processing components which are not illustrated in FIG. 1, such as an encryption unit or frequency spreader in a code division multiple access (CDMA) system.

The channel encoder 16 in the transmitter 12 receives a source data signal and encodes the source data signal to improve the recovery of the signal by the receiver 14. One type of signal-space coding of digital data is M-ary signaling. The channel decoder transforms k data bits into one of $M=2^k$ symbols in the signal space. For binary data signals, k=1. One class of signal-space coding is the convolutional code which may be implemented with a K-stage shift register. At each unit of time, k bits are shifted into the first k stages of the register while bits already in the registers are shifted to the right by k stages. At each unit of time, the contents of selected shift registers are added, subtracted or otherwise manipulated to obtain a number n of coded bits. By shifting the k bits into the register at each unit of time, each shifted set of k bits specifies a transition to a limited number of permissible successor states in the encoder. As a result, the encoded bits represent not only the current state of the encoder but also indicate historical information of the states of the encoder which can be derived from the received sequence of the encoded bits.

The encoded bits from the channel encoder 16 are inputted into the multiplexer 18. The multiplexer 18 combines the encoded bits with other signals that originate from different sources or have different characteristics. The modulator 20 receives the multiplexed signal and converts the signal to waveforms that may be transmitted over the channel 24. The modulated signal is inputted to the transmitter unit 22 which typically includes a high powered amplifier and an antenna to transmit the modulated signal over the channel 24.

During transmission of the signal, the channel 24 introduces noise, fading and jamming into the signal. The receiver 14 must detect the transmitted signal and try to recover the original source data signal from the transmitted signal. The receiver 14 includes a receiver unit 26, demodulator 27, demultiplexer 28 and channel decoder 30. The receiver unit 26 typically includes an antenna to detect the transmitted signal and a low-noise amplifier to amplify the signal. The demodulator 27 demodulates the signal while the demultiplexer 28 separates the signal into component signals.

The channel decoder 30 attempts to decode the demultiplexed signal, with the added noise and fading, to reconstruct the original source data signal. One well known method for decoding convolutional codes is the Viterbi algorithm originated by A. J. Viterbi and described in the IEEE Transactions on Information Theory, Vol. IT-13, pp. 260–269 (April 1967), which is incorporated by reference herein. The Viterbi algorithm uses a trellis having columns of nodes that represent the possible states of the channel encoder 16 of the transmitter 12 and branches between nodes representing the allowed transitions between states. When the channel encoder only transitions one bit in a unit period of time, i.e. k=1, the trellis code is binary and has two associated branches per node. If the channel encoder transitions more than one bit in a unit time period, i.e. k>1, then the trellis code is non-binary and has more than two associated branches per node.

Implementing a Viterbi algorithm for a non-binary trellis, i.e. a trellis with more than two branches per node, is much more complex than implementing a Viterbi algorithm for a binary trellis, i.e. a trellis with two branches per node because a significantly larger computational burden is placed on the channel decoder. This increased complexity has restricted the use of non-binary trellises for encoding and decoding data in commercial communications systems. Thus, a need has arisen in the industry for a simple and efficient method and decoder to perform decoding of convolutional codes using the Viterbi algorithm for a non-binary trellis.

SUMMARY OF THE INVENTION

Do The present invention is directed to a method for decoding a signal transmitted over a channel to determine a source data signal using a non-binary trellis. The first step is to separate the non-binary trellis into a plurality of binary butterfly trellises having nodes with two associated branches. A binary butterfly operation for each binary butterfly trellis designated in the non-binary trellis is performed to determine a most favorable path metrics associated with each node in the binary butterfly trellises. The method of the present invention then includes the step of comparing the most favorable path metrics associated with each node in the non-binary trellis as determined by performing binary butterfly operations to select a survivor path for each node in the non-binary trellis and determine an accumulated path metric for each node in the non-binary trellis.

The decoder of the present invention includes a first processor for performing a binary butterfly operation for a binary butterfly trellis and determining a most favorable path metric associated with each node in a binary butterfly trellis; and a second processor for instructing the first processor to perform the binary butterfly operation on a plurality of binary butterfly trellises designated within the non-binary butterfly trellis and for comparing the most favorable path metrics associated with each node in the non-binary trellis to determine a survivor path for each node in the non-binary trellis and an accumulated path metric for each node in the non-binary trellis.

BRIEF DESCRIPTION OF THE DRAWINGS

For a more complete understanding of the present invention and for further objects and advantages thereof, reference may now be had to the following description taken in conjunction with the accompanying drawings, in which like numerals are used for similar parts.

DETAILED DESCRIPTION OF THE INVENTION

The present invention will now be described more fully hereinafter with reference to the accompanying drawings, in which preferred embodiments of the invention are shown.

Figure 2:
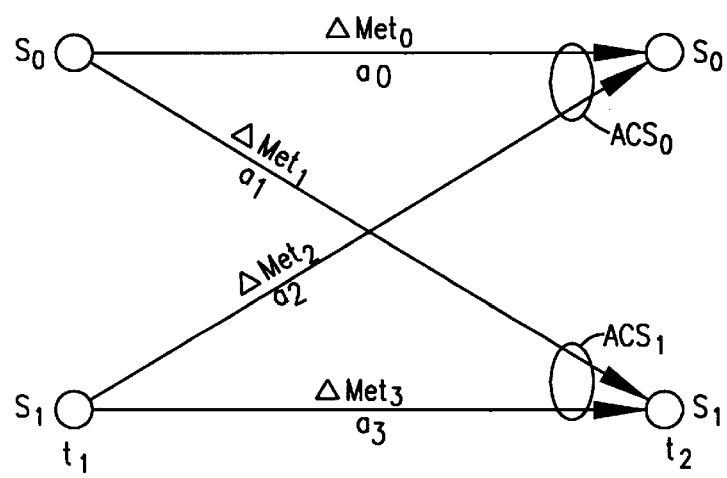
FIG. 2 illustrates a binary trellis with two states for decoding of convolutional codes by a decoder using a basic binary butterfly operation.

An example of the Viterbi algorithm using a binary trellis is illustrated in FIG. 2. The Viterbi algorithm uses a trellis diagram in which the nodes at each time illustrate the possible states of the encoded source data signal in a signal space S. In the example for the binary trellis in FIG. 2, the signal space S includes at least two signal states $S_0$ and $S_1$. The signal space S may be a range of analog signal amplitudes or a multidimensional space characteristic of frequency-shift-keying or phase-shift-keying systems. A transition between two states in the signal space is encoded in the transmitter into a unique code symbol from a set of symbols $A=\{a_1, a_2 \ldots\}$. For example, the transition from $S_0$ to $S_0$ may be represented by $a_0$, the transition from $S_0$ to $S_1$ may be represented by $a_1$, the transition from $S_1$ to $S_0$ may be represented by $a_2$, and the transition from $S_1$ to $S_1$ is represented by $a_3$ during the encoding by the transmitter. The sequence of states in the encoder may be decoded by the receiver by following a path through a Viterbi trellis such as that shown in FIG. 2.

Figure 1:
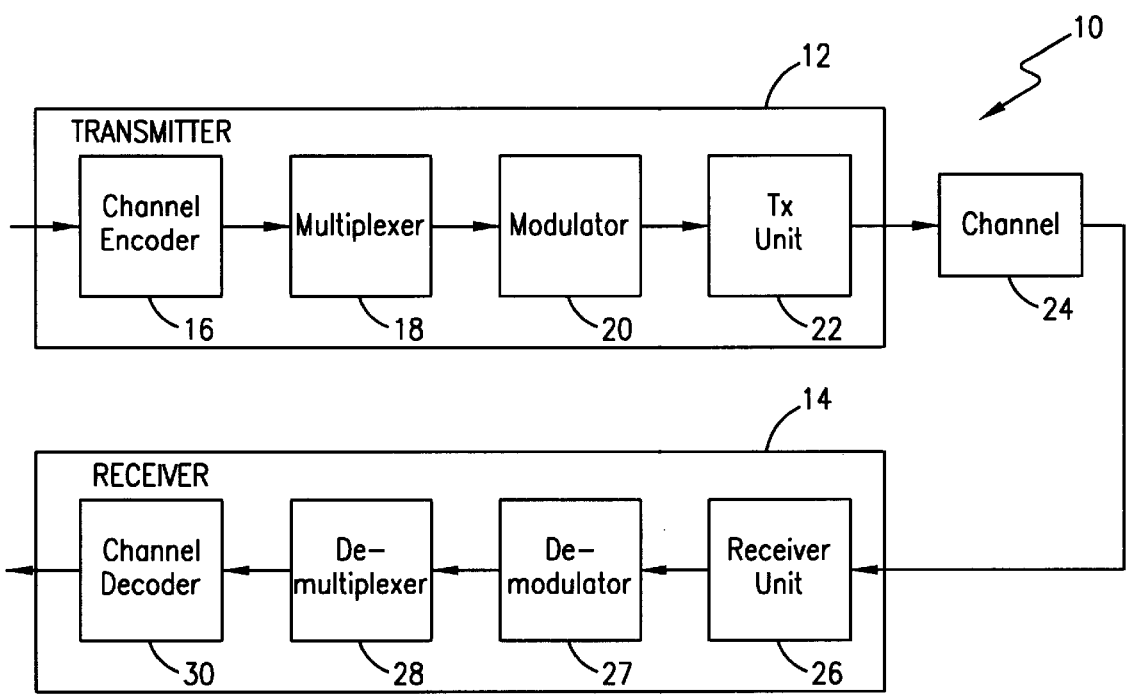
FIG. 1 illustrates a digital communications system in which the present invention may be implemented.

FIG. 2 illustrates a binary butterfly trellis in which each node has only two associated branches, i.e. each node may only be reached from two other nodes through only two branches. The nodes at each unit of time t in FIG. 1 represent the signal states $S_0$ and $S_1$ in the signal space S. The branches between the nodes in the trellis represent a transition between states. For each transition or branch, a unique symbol from a set $A=\{a_0, a_1, a_2, a_3\}$ is designated to represent that transition, as shown in FIG. 2.

In operation, the unique symbol A is determined by the encoded bits of the shift register in the encoder. A branch metric $\Delta Met_i$ is the distance (such as an Euclidian distance for analog signals or Hamming distance for digital signals) between the symbol from the set A for that branch or transition and the actual received signal. For example, the metric value denoted $\Delta Met_0$ is the distance between the received signal and symbol $a_0$, the metric value $\Delta Met_1$ is the distance between the received signal and symbol $a_1$, the metric value $\Delta Met_2$ is the distance between the received signal and symbol $a_2$ and the metric value $\Delta Met_3$ is the distance between the received signal and symbol $a_3$. A path metric for a state is denoted $Met_{Si}$ and is the sum of the branch metrics between a chosen path through the trellis to that state.

For any sequence of received signals, the decoding method must search the trellis for the path of symbols $a_0$, $a_1$, $a_2$, ... represented by each branch which most closely fits the received signal values, that is the path having the most favorable path metric. The Viterbi algorithm for a binary signal determines the most favorable path metric through a binary butterfly trellis. Two candidate path metrics per node or state are calculated. Each candidate path metric calculated represents a different branch or transition to that state. For example, for the state $S_0$ at $t_2$, the two candidate path metrics calculated are $Met_{S0}+\Delta Met_0$ and $Met_{S1}+\Delta Met_2$. Once calculated, the two candidate path metrics are compared to determine which path metric is most favorable. In general, the most favorable path metric is the path metric with the smallest value as determined by Hamming distance for digital signals or Euclidean distance for analog signals. The path associated with the most favorable path metric is then selected. An accumulated path metric $Met_{S0}$ for the state $S_1$ at $t_2$ is updated to equal the most favorable path metric. This described path selection operation for the state $S_0$ at $t_2$ is labeled $ACS_0$ (Add-Compare-Select) in FIG. 2.

Similarly, a path selection operation is performed for the state $S_1$ at $t_2$. Two candidate path metrics $Met_{S0}+\Delta Met_1$ and $Met_{S1}+\Delta Met_3$ for the state $S_1$ are calculated. The most favorable path metric is determined and the path associated with the most favorable path metric is selected. The path selection operation for this node is labeled $ACS_1$ (Add-Compare-Select) in FIG. 2. In general, the path selected for a state S is known as the survivor path.

Figure 3:
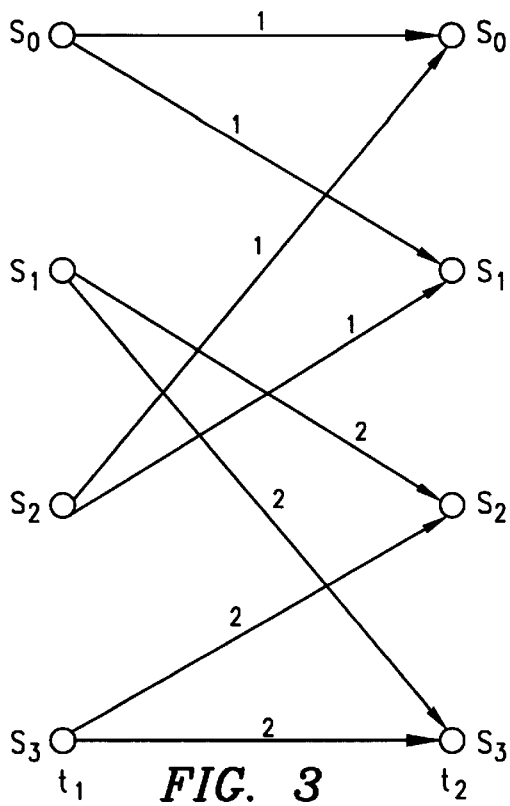
FIG. 3 illustrates a binary trellis with more than two states for decoding of convolutional codes by a decoder using a basic binary butterfly operation.

The above described Viterbi algorithm performed for a binary trellis, i.e. a trellis with two branches per state or node and having two nodes or states at a unit period of time, is known as a basic binary butterfly operation. The basic binary butterfly operation may be performed multiple times in a binary trellis with more than two states to determine the survivor path for each node or state. However, each node or state still only has two associated branches. For example, in FIG. 3, a binary trellis with four states $S_0$, $S_1$, $S_2$ and $S_3$ at time $t_1$ and $t_2$ is illustrated. A first basic binary butterfly operation may be performed to determine the survivor path for the states $S_0$ and $S_1$ in the binary trellis, labeled 1 in FIG. 3. A second basic binary butterfly operation may then be performed to determine the survivor path for the states $S_2$ and $S_3$ in the binary trellis at time $t_2$, labeled 2 in FIG. 3.

The basic binary butterfly operation described above can be performed by very efficient accelerator semiconductor chips well known in the prior art, such as the TMS320C54X DSP chip from Texas Instruments.

Figure 4:
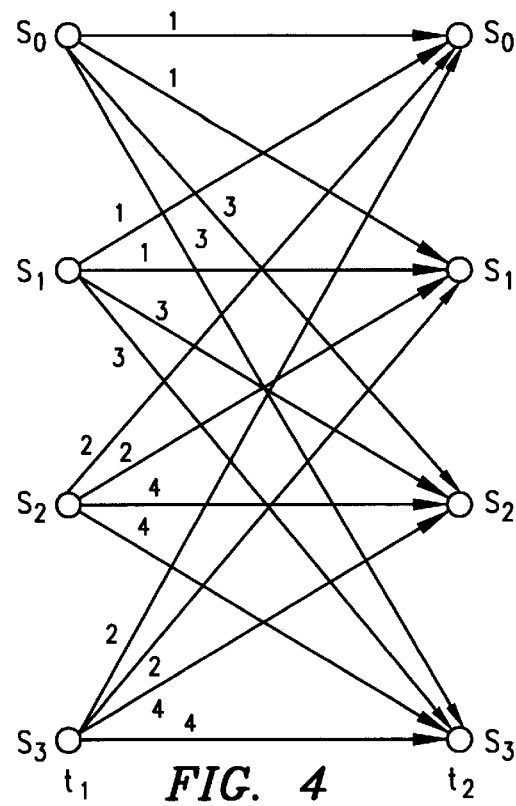
FIG. 4 illustrates a non-binary trellis for decoding of convolutional codes by a decoder of the present invention.

FIG. 4 illustrates a non-binary trellis for decoding of convolutional codes by a decoder of the present invention. In a non-binary trellis, each node $S_i$ may have more than two possible branches. Thus, a transition to a state $S_i$ at unit period of time $t_2$ may be from a set of states $S_{im}=\{S_{i1}, S_{i2}, S_{i3} \ldots S_{im}\}$ at a unit period of time $t_1$, wherein the index m is greater than two. Unique symbols from set A is defined for all transitions $Ti=\{a_{i1}, a_{i2} \ldots a_{im}\}$ associated with the set of states $S_i$ such that $t(S_{im},S_m)=a_{im}$. A trellis diagram can be defined explicitly by the sets $S_i$ and $T_i$ for each state that is represented by a node of the trellis diagram.

In the trellis diagram of FIG. 4, the signal space of the source data signal includes four states $S_i=\{S_0, S_1, S_2 \text{ and } S_3\}$ with four branches or transitions associated with each state. Thus a transition to state $S_0$ at $t_2$ may be from a set of states $S_{0,4}=\{S_{0,0}, S_{0,1}, S_{0,2}, S_{0,3}\}$. Unique symbols from the set A for the transitions to S0 may be represented as: $t(S_{o,o}, S_0)=a_0$, $t(S_{0,1}, S_0)=a_1$, $t(S_{o,2},S_0)=a_2$, and $t(S_{o,3}, S_0)=a_3$. Similar representations may be shown for the other states $S_1$, $S_2$ and $S_3$ in the trellis diagram.

The present invention decodes a convolutional code using a non-binary trellis diagram by designating binary butterfly trellises within the non-binary trellis. Each binary butterfly trellis has only two states at each unit period of time and two branches per state. The two states at a unit period of time may be disjoint.

For example, the non-binary trellis of FIG. 4 is separated into four binary butterfly trellises designated by the numbers 1 through 4. In the present invention, the binary butterfly trellises are each analyzed using the basic binary butterfly operation and the results for each node from the two basic binary butterfly operations are compared to determine the survivor path for that node.

Figure 5:
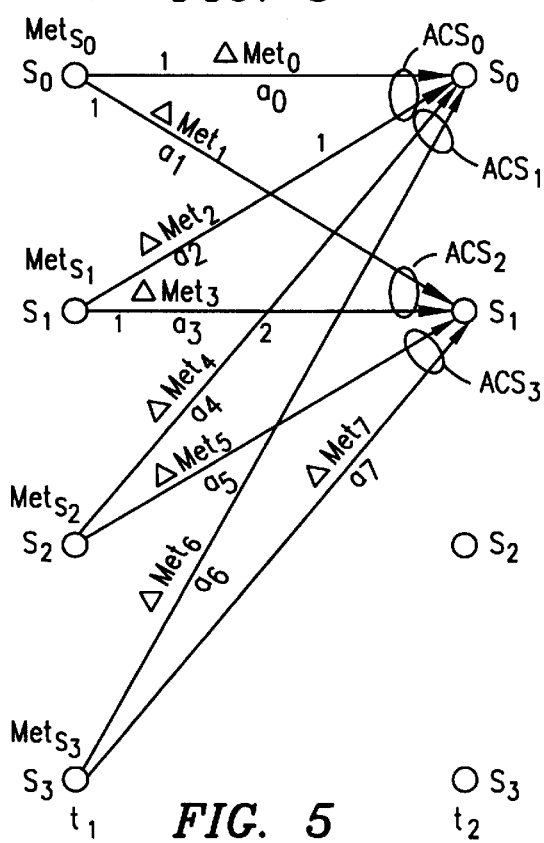
FIG. 5 illustrates a non-binary trellis for decoding of convolutional codes illustrating a modified basic butterfly binary operation.

An example for determining the survivor paths for nodes S0 and S1 at time t2 is described with reference to FIG. 5. The non-binary trellis of FIG. 5 illustrates the two binary basic butterflys designated as 1 and 2 in FIG. 4.

For each state $S_i$ at time $t_1$, the path metric $Met_{Si}$ is known prior to the beginning of the operation. The path metric $Met_{si}$ equals the sum of the previous branch metrics between a chosen path through the trellis to that state $S_i$. Alternatively, if $t_1$ is the first state in the decoding operation, the path metric $Met_{Si}$ may be set to an initial value. The present invention performs or executes a binary basic butterfly operation on a first designated binary basic butterfly trellis in the non-binary trellis. For example, a binary basic butterfly operation is first performed for the designated binary basic butterfly labeled as 1 in FIG. 5. The first designated binary butterfly trellis includes states $S_0$ and $S_1$ at unit period of time $t_1$ and states $S^0$ and $S_1$ at unit period of time $t_2$.

For the state $S_0$ in the first designated binary basic butterfly at $t_2$, the operation $ACS_0$ is performed. The two candidate path metrics $Met_{s0}+\Delta Met_0$ and $Met_{s1}+\Delta Met_2$ are calculated. Once calculated, the two candidate path metrics are compared to determine which path metric is most favorable. As explained above, the most favorable path metric is generally the path metric with the smallest value. The most favorable path metric may for example be determined by Hamming distance for digital signals or Euclidean distance for analog signals. The path associated with the most favorable path metric is then determined for the operation $ACS_0$.

Rather than selecting this as the survivor path for $S_0$, the path and corresponding most favorable path metric is stored as the result of the operation $ASC_0$. The present invention then performs the operation $ACS_2$ and calculates for the state $S_1$ at $t_2$, the two candidate path metrics $Met_{s0}+\Delta Met_1$ and $Met_{s1}+\Delta Met_3$. The most favorable path metric is determined and the survivor path associated with the most favorable path metric is determined for the operation $ACS_2$. Again, rather than selecting this as the survivor path for $S_1$, the path and corresponding most favorable path metric is stored as the result of the operation $ACS_2$.

Next, the present invention executes a modified basic binary butterfly operation for the second designated basic binary butterfly trellis labeled 2 in FIG. 5. This second designated binary butterfly trellis includes states $S_2$ and $S_3$ at unit period of time $t_1$ and states $S_0$ and $S_1$ at unit period of time $t_2$. The operation $ACS_1$ is performed for the state $S_0$ at $t_2$. The two candidate path metrics $Met_{s2}+\Delta Met_4$ and $Met_{s3}+\Delta Met_6$ are calculated. The most favorable path metric is determined and the path associated with the most favorable path metric is selected. This path and most favorable path metric are stored for the operation $ACS_1$. Second, the operation $ACS_3$ is performed for the state $S_1$ at $t_2$. The two candidate path metrics $Met_{s2}+\Delta Met_5$ and $Met_{s3}+\Delta Met_7$ are calculated. The most favorable path metric is determined and the path associated with the most favorable path metric is determined for the operation $ACS_3$. This path and most favorable path metric are stored for the operation $ACS_3$.

The present invention next determines the survivor path for each node or state S in the non-binary trellis by comparing the most favorable path metric for each ACS operation performed in the binary basic butterfly operations corresponding to that state in the non-binary trellis. For example, for state $S_0$ at unit period of time $t_2$, the most favorable path metric stored as the result of $ACS_0$ associated with state $S_0$ is compared to the most favorable path metric stored as the result of $ACS_1$ associated with state $S_0$. As explained above, the operation $ACS_0$ was performed during the first basic binary butterfly operation while the operation $ACS_1$ was performed during the second basic binary butterfly operation. However, since both $ACS_0$ and $ACS_1$ operations were performed for branches to state $S_0$ at $t_2$, their results are compared to determine the survivor path for state $S_0$. The survivor path for state $S_0$ at $t_2$ is the path corresponding to the most favorable path metric between the two stored metrics of operations $ACS_0$ and $ACS_1$. The final accumulated metric $Met_{S0}$ for State $S_0$ at $t_2$ equals this most favorable path metric between the two stored metrics of operations $ACS_0$ and $ACS_1$.

The survivor path and accumulated metric $Met_{S1}$ is similarly determined for state $S_1$ at $t_2$. The most favorable path metric stored as the result of operation $ACS_2$ associated with state $S_1$ is compared to the most favorable path metric stored as the result of operation $ACS_3$ associated with state $S_1$. The survivor path for state $S_1$ at $t_2$ is the path corresponding to the most favorable path metric between the two stored metrics of operations $ACS_2$ and $ACS_3$. The final accumulated metric $Met_{S1}$ for state $S_1$ at $t_2$ equals the most favorable path metric between the two stored metrics of operations $ACS_2$ and $ACS_3$.

Similarly, the present invention performs modified binary butterfly operations for the basic binary butterfly trellises 3 and 4 shown in FIG. 4 to determine the survivor paths for states $S_2$ and $S_3$. By designating binary butterfly trellises within the non-binary trellis, the present invention thus simplifies the computational load of the decoder.

Figure 6:
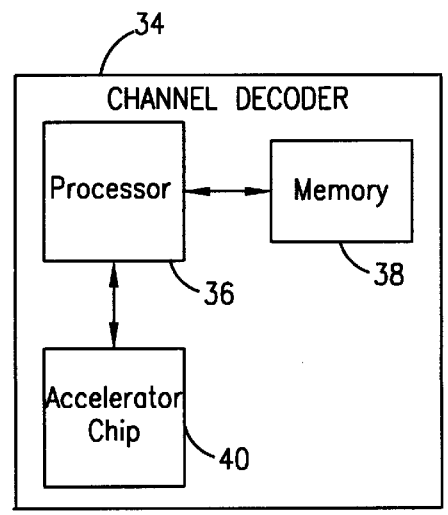
FIG. 6 illustrates a decoder which may be used to implement the present invention.

A typical, prior art chip for performing binary butterfly operations may be used to implement the present invention in a channel decoder 34 with little or no modification, as shown in FIG. 6. The channel decoder 34 includes a processor 36, memory 38 and binary butterfly accelerator chip 40. The processor 36 controls the operation of the channel decoder 34 in accordance with the present invention. The binary butterfly accelerator chip 40 performs basic a binary butterfly operation on a given binary butterfly trellis and outputs the results of the ACS operation for each node of the binary butterfly trellis. The binary butterfly accelerator chip 40 may be the accelerator semiconductor TMS320C54X chip from Texas Instruments. The memory 38 may be located on the processor chip 40 or in an outside cache or RAM from the processor 40. Though FIG. 6 illustrates that the channel decoder 34 includes a processor 36 and a separate binary butterfly accelerator chip 40, a person of skill in the art would appreciate that the functions of the two chips may be incorporated in a single processor.

Figure 7:
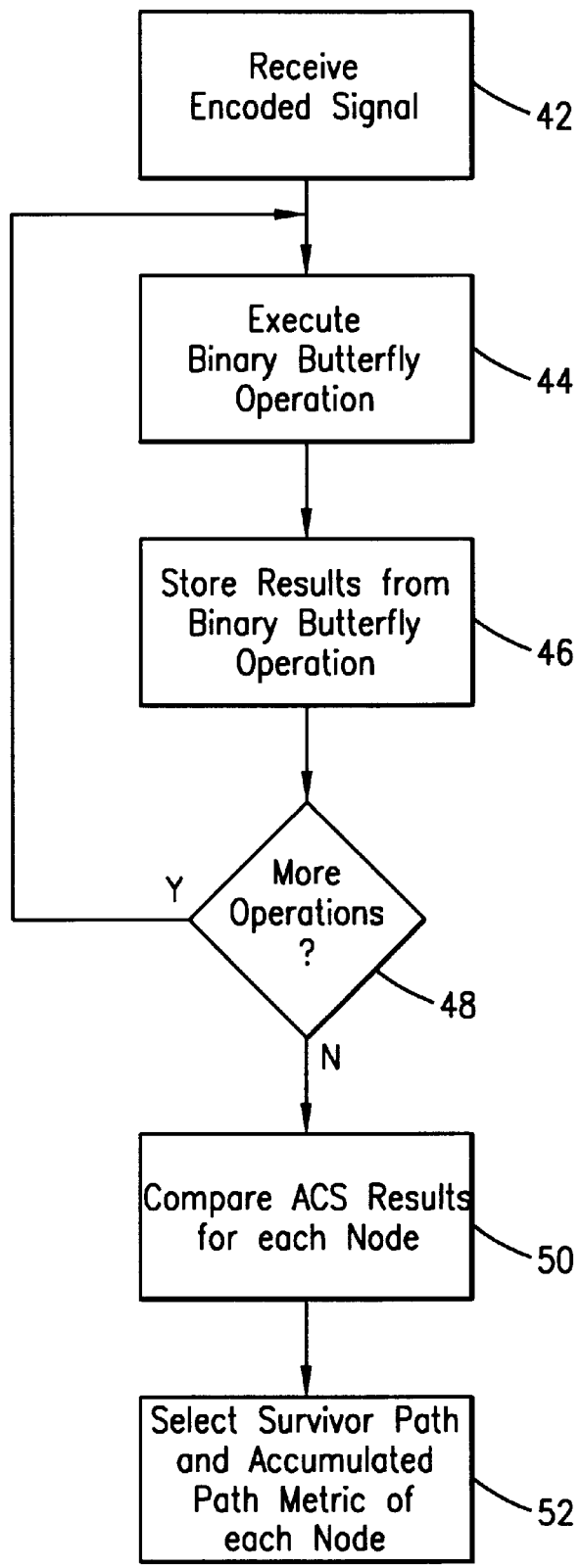
FIG. 7 illustrates a flow chart of the method of operation of the decoder of the present invention to decode convolutional codes using modified basic binary butterfly operations.

The operation of the channel decoder 34 to decode convolutional codes using a non-binary trellis is explained with reference to FIG. 7. FIG. 7 illustrates a flow chart of the operation of the channel decoder 34 of the present invention. The channel decoder 34 has been pre-programmed with a non-binary trellis, states $S_i$, transitions T, and symbol set A for the desired decoding process. The non-binary trellis for the desired decoding process has also been separated into a plurality of designated binary butterfly trellises.

In step 42 of FIG. 7, the channel decoder 34 receives an encoded signal symbol from the demultiplexer 38. The processor 36 instructs the binary butterfly accelerator chip 40 to perform a basic binary butterfly operation for one of the designated basic butterfly trellises in step 44. The binary butterfly accelerator chip performs the basic butterfly operation and determines results of two ACS operations, one for each the two nodes of the basic binary butterfly trellis. The results of the ACS operations for the two nodes in the basic butterfly operation are stored in the memory 38, as shown in step 46. The path and most favorable path metric determined in the two ACS operations are designated in the memory 38 along with associated state or node for the particular ACS operation.

The processor 36 next determines if more basic binary butterfly trellises are designated in the non-binary trellis in step 48. If yes, the processor 36 returns to step 44 and instructs the binary butterfly accelerator chip 40 to perform a basic butterfly operation for the next designated basic butterfly trellis.

If in step 48, the processor 36 determines that a binary butterfly operation has been performed for each basic butterfly trellis, the processor 36 determines the survivor paths for each state or node in the non-binary trellis. The processor 36 compares the most favorable path metric for each ACS operation stored in memory 38 associated with a state or node in the non-binary trellis and selects the most favorable path metric and the corresponding survivor path for each state. The processor 36 updates the metric for each state to the selected most favorable path metric and stores the corresponding survivor path in memory 38. The processor 36 continues to process the encoded signal symbols in the message until completed.

Alternatively, the processor 36 may perform steps 50 and 52 of FIG. 7 to select a survivor path for a state after the binary butterfly accelerator chip computes the binary butterfly operations associated with such state. The binary butterfly accelerator chip may simultaneously compute binary butterfly operations associated with other states as in steps 44 and 46 of FIG. 7.

The present invention has significant advantages over prior art decoders for decoding convolutional codes using non-binary trellises. Using a Viterbi algorithm to directly solve a non-binary trellis requires highly complex architectures and great computational loads. The present invention decodes a non-binary trellis by separating the non-binary trellis into a plurality of binary butterfly trellises and performing a modified binary butterfly operation on each of the binary butterfly trellises. As a result, the present invention takes advantage of highly efficient and simpler architectures that perform binary butterfly operations.

While it is believed that the operation and structure of the present invention is apparent from the foregoing description, the method of operation and structure of the present invention as shown and described has been characterized as being preferred and changes and modifications and substitutions may be made therein without departing from the spirit and scope of the invention as defined in the following claims.

What is claimed is:

1. A method of decoding an encoded signal transmitted over a channel to determine a source data signal using a non-binary trellis with a plurality of nodes, comprising the steps of:

designating a plurality of binary butterfly trellises within the non-binary trellis, wherein each ending node of the non-binary trellis has at least two binary trellises associated therewith;

performing a binary butterfly operation for each designated binary butterfly trellis to determine a most favorable path metric associated with the designated binary butterfly trellises such that each ending node of the non-binary trellis will have at least two most favorable path metrics associated therewith; and comparing the at least two most favorable path metrics associated with each node in the non-binary trellis determined in said step of performing to select a survivor path for each node in the non-binary trellis.

2. The method of claim 1, further comprising the step of storing the plurality of most favorable path metrics associated with each node in the binary butterfly trellises determined in said binary butterfly operation step in a memory.

3. The method of claim 2, further comprising the step of determining the source data signal from the survivor path in the non-binary trellis.

4. The method of claim 3, wherein the step of designating a plurality of binary butterfly trellises within the non-binary trellis includes the steps of:

designating a first binary butterfly trellis having two beginning nodes represented in the non-binary trellis as at a first unit period of time and having two ending nodes represented in the non-binary trellis as at a second unit period of time; and designating a second binary butterfly trellis having two alternate beginning nodes represented in the non-binary trellis as at the first unit period of time and having said two ending nodes represented in the non-binary trellis as at the second unit period of time.

5. The method of claim 4, wherein the step of performing a binary butterfly operation for each designated binary butterfly trellis, comprises the steps of:

performing a binary butterfly operation for the first designated binary butterfly trellis, including the steps of:
determining a first candidate path metric for a first branch into a first ending node of the first designated binary butterfly operation;
determining a second candidate path metric for a second branch into the first ending node of the first designated binary butterfly operation; and
determining a first most favorable path metric for the first ending node from the first and second candidate metric for the first ending node;
determining a first candidate path metric for a first branch into the second ending node of the first designated binary butterfly operation;
determining a second candidate path metric for a second branch into the second ending node of the first designated binary butterfly operation; and
determining a first most favorable path metric for the second ending node from the first and second candidate metric for the second ending node.

6. The method of claim 5, wherein the step of performing a binary butterfly operation for each designated binary butterfly trellis, further comprises the steps of:

performing a binary butterfly operation for the second designated binary butterfly trellis, including the steps of:
determining a first candidate path metric for a first branch into the first ending node of the second designated binary butterfly trellis;
determining a second candidate path metric for a second branch into the first ending node of the second designated binary butterfly trellis; and
determining a second most favorable path metric for the first ending node of the second designated binary butterfly trellis from the first and second candidate metrics for the first ending node;

determining a first candidate path metric for a first branch into the second ending node of the second designated binary butterfly trellis;

determining a second candidate path metric for a second branch into the second ending node of the second designated binary butterfly trellis; and determining a second most favorable path metric for the second ending node for the second designated binary butterfly trellis from the first and second candidate metric for the second ending node.

7. The method of claim 6, wherein the step of comparing the at least two most favorable path metrics associated with each ending node in the non-binary trellis to select the survivor path, comprises the steps of:

comparing the first most favorable path metric for the first ending node of the first designated binary butterfly trellis and the second most favorable path metric for the first ending node of the second designated binary butterfly trellis; and selecting the survivor path associated with a most favorable value between the first most favorable path metric and the second most favorable path metric for the first ending node.

8. The method of claim 7, wherein the step of comparing the at least two most favorable path metrics associated with each node in the non-binary trellis to select the survivor path, comprises the steps of:

comparing the first most favorable path metric for the second ending node of the first designated binary butterfly trellis and the second most favorable path metric for the second ending node of the second designated binary butterfly trellis; and selecting the survivor path associated with a most favorable value between the first most favorable path metric and the second most favorable path metric for the second ending node.

9. The method of claim 8 further including the steps of:

determining an accumulated metric value for the first ending node in the non-binary trellis equal to the most favorable value between the first most favorable path metric and the second most favorable path metric for the first ending node; and determining an accumulated metric value for the second ending node in the non-binary trellis equal to the most favorable value between the first most favorable path metric and the second most favorable path metric for the second ending node.

10. An apparatus for decoding an encoded signal transmitted over a channel to determine a source data signal, based on a non-binary trellis with a plurality of nodes, comprising:

a first processor for performing a binary butterfly operation for a binary butterfly trellis and determining at least two most favorable path metric associated with each ending node in a non-binary butterfly trellis; and a second processor for instructing the first processor to perform the binary butterfly operation on a plurality of binary butterfly trellises designated within the non-binary trellis, wherein each ending node of the non-binary trellis has at least two binary trellises associated therewith, and for comparing the at least two most favorable path metrics associated with each ending node in the non-binary trellis to determine a survivor path for each node in the non-binary trellis.

11. The apparatus of claim 10, further comprising a memory for storing the at least two most favorable path metrics associated with each ending node in a non-binary butterfly trellis determined by said first processor.

12. The apparatus of claim 11, wherein said first processor is a binary butterfly accelerator.

13. The apparatus of claim 12, wherein said second processor decodes the source data signal from the survivor path in the non-binary trellis.

14. An apparatus for decoding an encoded signal transmitted over a channel, said encoded signal being encoded prior to transmission in accordance with a code represented by a non-binary trellis, said non-binary trellis having a plurality of nodes and more than two branches per node, said apparatus comprising:

means for designating a plurality of binary butterfly trellises within the non-binary trellis, wherein each ending node of the non-binary trellis has at lease two binary trellises associated therewith;

means for performing a binary butterfly operation for each designated binary butterfly trellis to determine a most favorable path metric associated with the binary butterfly trellises such that each node of the non-binary trellis will have at least two most favorable path metrics associated therewith; and means for comparing the at least two most favorable path metrics associated with a node in the non-binary trellis determined by said means for performing a binary butterfly operation; and means for selecting a survivor path in the non-binary trellis for the node in the non-binary trellis.

15. The apparatus of claim 14 further comprising means for storing a most favorable path metric associated with each node in the designated binary butterfly trellis.

16. The apparatus of claim 15, further including means for determining the source data signal from the survivor path in the non-binary trellis.

17. The apparatus of claim 16, wherein said means for performing a binary butterfly operation includes a binary butterfly accelerator.

18. The apparatus of claim 17, wherein said means for comparing and means for selecting are a processor.

* * * * *

UNITED STATES PATENT AND TRADEMARK OFFICE
CERTIFICATE OF CORRECTION

PATENT NO.    : 6,115,436
DATED         : September 5, 2000
INVENTOR(S)   : Ramesh et al.

It is certified that error appears in the above-identified patent and that said Letters Patent is hereby corrected as shown below:

<u>Column 1,</u>
Line 12, replace "system" with -- system 10 --

<u>Column 2,</u>
Line 25, replace "Do The" with -- The --

Signed and Sealed this

Sixth Day of November, 2001

Attest:

NICHOLAS P. GODICI
Attesting Officer    Acting Director of the United States Patent and Trademark Office